United States Patent [19]
Yoshino et al.

[11] Patent Number: 5,262,666
[45] Date of Patent: Nov. 16, 1993

[54] SEMICONDUCTOR DEVICE WITH A NICKEL ALLOY PROTECTIVE RESISTOR

[75] Inventors: Yoshimi Yoshino, Inuyama; Hideto Morimoto, Aichi; Kenichi Ao, Toyoake, all of Japan

[73] Assignee: Nippondenso Co., Ltd., Kariya, Japan

[21] Appl. No.: 831,094

[22] Filed: Feb. 10, 1992

Related U.S. Application Data

[63] Continuation of Ser. No. 713,587, Jun. 11, 1991, abandoned, which is a continuation of Ser. No. 521,029, May 9, 1990, abandoned.

[30] Foreign Application Priority Data

May 15, 1989 [JP] Japan .................................. 1-120972
Feb. 2, 1990 [JP] Japan .................................. 2-24880

[51] Int. Cl.$^5$ ...................... H01L 27/22; H01L 29/82; H01L 29/96
[52] U.S. Cl. .................................. 257/427; 257/491; 257/537
[58] Field of Search ............... 357/27, 51; 257/421, 257/427, 491, 537

[56] References Cited

U.S. PATENT DOCUMENTS

| 4,024,489 | 5/1977 | Bajorek et al. ............ 338/32 R |
|---|---|---|
| 4,319,188 | 3/1982 | Ito et al. ..................... 324/173 |
| 4,385,283 | 5/1983 | Delapierre ................... 324/51 |
| 4,499,515 | 2/1985 | Piotrowski et al. ......... 357/27 |
| 4,607,271 | 8/1986 | Popovic et al. ............. 357/27 |
| 4,835,588 | 5/1989 | Nawata et al. .............. 357/51 |
| 4,937,521 | 6/1990 | Yoshino et al. ............. 324/117 R |
| 5,005,064 | 4/1991 | Yoshino et al. ............. 357/27 |

FOREIGN PATENT DOCUMENTS

| 8704192 | 7/1988 | Fed. Rep. of Germany ...... 328/252 |
|---|---|---|
| 55-111184 | 8/1980 | Japan ............................. 338/32 R |
| 59-18458 | 1/1984 | Japan . |
| 59-46079 | 3/1984 | Japan . |
| 59-188578 | 10/1984 | Japan . |
| 60-85501 | 5/1985 | Japan . |
| 2064140 | 6/1981 | United Kingdom ............. 357/27 |

Primary Examiner—Jerome Jackson
Assistant Examiner—D. Monin
Attorney, Agent, or Firm—Cushman, Darby & Cushman

[57] ABSTRACT

A semiconductor device including a substrate, a semiconductor element formed on the substrate, a terminal formed on the substrate and electrically connected to the semiconductor element, and a protective resistor formed on the substrate and electrically connected between the semiconductor element and the terminal. The resistor is composed of a ferromagnetic magnetoresistive material including Ni alloy. The device may be extended to detect magnetism by adding a magnetoresistive element composed of a ferromagnetic magnetoresistive material including the same Ni alloy as for the protective resistor and deposited at the same time. The device is superior in an anti-noise characteristic and is integrated. Furthermore, the device for detecting magnetism is formed with a lower cost.

10 Claims, 4 Drawing Sheets

SEMICONDUCTOR DEVICE WITH A NICKEL ALLOY PROTECTIVE RESISTOR

This is a continuation of application Ser. No. 07/713,587, filed on Jun. 11, 1991, which was abandoned upon the filing hereof which was a continuation of Ser. No. 07/521,029, filed May 9, 1990, abandoned.

BACKGROUND OF THE INVENTION

1. Field of the Invention

This invention relates to a semiconductor device which includes a protective resistor and in an extended arrangement to a device for detecting magnetism including semiconductor elements, which are prevented from being destroyed by an applied high voltage owing to noise, or the like.

2. Description of the Related Art

A conventional device for detecting magnetism includes a substrate and mounted thereon a thin film type ferromagnetic magnetoresistive element essentially consisting of a ferromagnetic body. This conventional device detects changes of magnetism, for example as changes of an electric voltage, using the characteristic that a value of the resistance of the ferromagnetic magnetoresistive element is changed by applying magnetism (or a magnetic field) thereto.

When such ferromagnetic magnetoresistive elements are used as parts for an automobile, there is a possibility that a high voltage (for example, the noise from an ignition device or energy accumulated as a reactance component) will be applied to the device and will destroy the device, including a semiconductor element or the like, which processes signals from the ferromagnetic magnetoresistive element.

To solve such a problem, use has been made of another conventional device, a Zener diode, which has a large capacitance to absorb the high voltage. However, since a Zener diode is constructed as a discrete part and its size is very large, it is impossible to integrate it with other circuit parts. Therefore, to make an integrated circuit, usually a protective resistor for protection of the electric circuit is formed on an IC chip. However if the resistor is formed by diffusion, the size of the diffusion resistor must be considerably large since a diffusion resistor is easily broken down by large energy. Hence, the breakdown voltage of the PN junction thereof must be increased.

The technique of forming a polycrystalline silicon resistor on a silicon dioxide film as the protective resistor is also used in the prior art. However, there is a limitation for integration, because a polycrystalline silicon resistor is easily broken down by large energy, too. Furthermore, since a conventional device for detecting magnetism does not include a MOSFET using a polycrystalline silicon as a gate, but mainly includes a bipolar transistor as a circuit component of the circuit for processing the signals from the magnetoresistive element, there process of forming a polycrystalline silicon resistor must be added.

SUMMARY OF THE INVENTION

An object of this invention is to provide a semiconductor device and also a device for detecting magnetism, each of which includes a protective resistor having a superior anti-noise characteristic and can be integrated.

Another object of this invention is to provide a device for detecting magnetism, and method for making same, which can be accomplished with a low cost.

To accomplish the above objects, a device according to this invention includes a substrate, a semiconductor element formed on the substrate, a terminal formed on the substrate and electrically connected to the semiconductor element, and a protective resistor formed on the substrate and electrically connected between said semiconductor element and said terminal, the resistor being composed of a ferromagnetic magnetoresistive material including nickel (Ni) as a component.

Further, the device of this invention for detecting magnetism includes a magnetoresistive element composed of a ferromagnetic magnetoresistive material including Ni as a component thereof, a semiconductor element for processing a signal from the magnetoresistive element, and a protective resistor electrically connected to the semiconductor element and composed of a ferromagnetic magnetoresistive material including Ni as a component and preferably of the same material as for the magnetoresistive element. The elements and resistor are all on the same substrate.

Other objects and advantages will become apparent from the following detailed description of the invention and the appended claims.

DETAILED DESCRIPTION OF THE PREFERRED EMBODIMENTS

The invention will be described with reference to the preferred embodiments.

Figure 1:
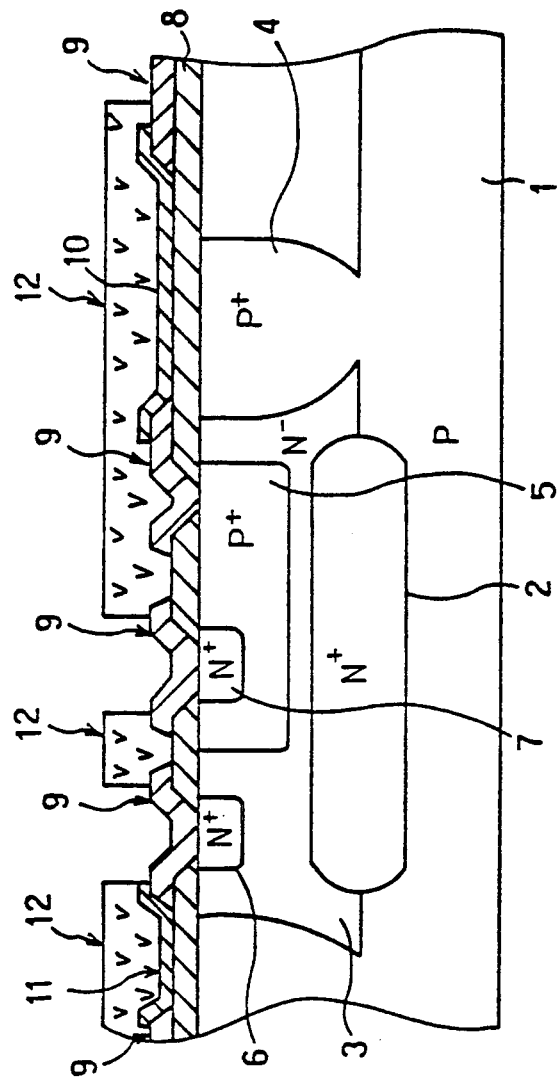
FIG. 1 is a cross sectional view of a first embodiment of this invention.

FIG. 1 is a cross sectional view of a first embodiment of this invention, in which a signal processing circuit having a bipolar transistor as a semiconductor element is integrated in the same substrate with a device for detecting magnetism.

In FIG. 1, a P type semiconductor substrate 1 is provided with an N+ type buried layer 2, an N− type epitaxial layer 3, a P+ type element isolating region 4, a P+ type diffusion region 5 and N+ type diffusion regions 6 and 7 which are formed on the main surface of the substrate, using a known semiconductor production technology.

The N+ type buried layer 2, N− type epitaxial layer 3, P− type diffusion region 5 and N+ type diffusion regions 6 and 7 form a vertical type NPN bipolar transistor 20, which amplifies a output signal from the ferromagnetic magnetoresistive element 10 as described later.

A film 8 of silicon dioxide is deposited on a main surface of the substrate by sputtering, whereby the main surface is covered with the film. Then, openings for making electric contacts with the aforementioned transistor 20, at regions 5, 6 and 7 for example, are selectively created in the silicon dioxide film 8 by a photolithography process.

Thereafter, aluminium (Al) is deposited on the whole surface of film 8 and in those openings, and the aluminum is etched in a predetermined pattern to form conductive wiring 9 on the remaining portion.

Then, a ferromagnetic magnetoresistive material including a Ni alloy, preferably including Ni as a main component, and further including Fe and/or Co, for example an alloy of Ni-Fe or Ni-Co, is selectively deposited on the surface of conductive wiring 9 and on exposed parts of the silicon dioxide film 8 to form a thin film of ferromagnetic magnetoresistive material having a thickness of 1000 A. Then, the thin film is etched to form predetermined patterns for the ferromagnetic magnetoresistive element 10 and the protective resistor 11 simultaneously. Ferromagnetic magnetoresistive element 10 is electrically connected with the P+ type diffusion region 5 which functions as a base region of the bipolar transistor 20. Protective resistor 11 is electrically connected with the N− type epitaxial layer 3 and the N+ type diffusion region 6 which function as the collector region of the bipolar transistor 20. Further, a protecting film 12 is then formed on the surface, and an opening is provided by etching film 12 only at the position where a conducting terminal is to be mounted such as on conductive wiring 9 above regions 6 and 7. Finally, a suitable heat treatment of the film is carried out, and the device for detecting magnetism of the embodiment is thus obtained.

Since protective resistor 11 for the bipolar transistor 20 is not formed by adding a special process as in the conventional technology, but is formed simultaneously with the forming of ferromagnetic magnetoresistive element 10, the prior art extra process is eliminated, Therefore, the device for detecting magnetism can be produced with a lower cost. Further, protective resistor 11 is superior to the prior art in its anti-noise characteristic since it is made from the ferromagnetic magnetoresistive material.

In the above embodiment, the value of the resistance of the ferromagnetic magnetoresistive element 10 varies in accordance with the magnetism to be measured. As later discussed in regard to FIG. 3, such a variation is converted into a variation of a voltage and the converted signal is transferred to a signal processing circuit, that is, the bipolar transistor 20 which outputs an amplified signal to circuits connected to the transistor 20.

Figure 2:
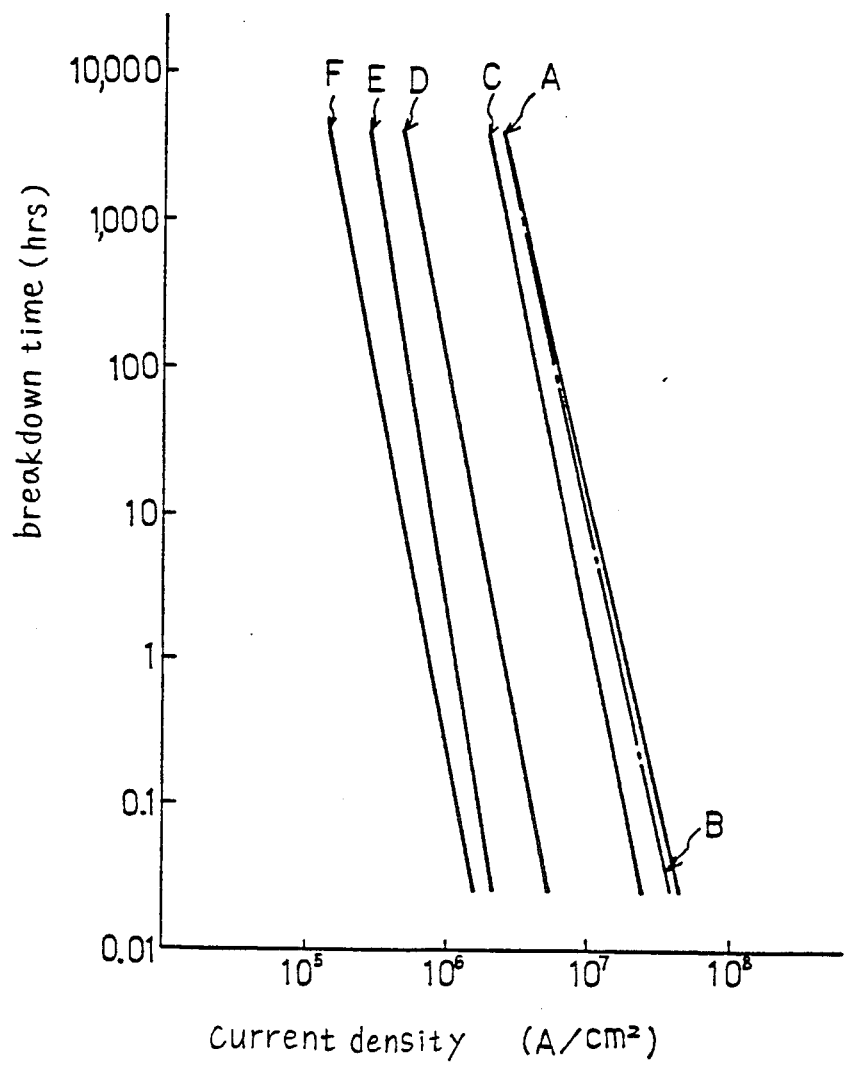
FIG. 2 is a graph indicating the relationship between the current density and the breakdown time.

FIG. 2 shows the relationship between the current density and the breakdown time, that is, the anti-noise characteristic (the anti-high current characteristic) of various materials. In FIG. 2, the lines A and B show the characteristics of protective resistors 11 respectively made from a Ni-Co alloy and a Ni-Fe alloy. Line C shows the characteristic for the case when Al, which is often applied in the semiconductor field, is applied. Line D shows shows the characteristic for the case when a Si-Cr resistor, which is used as a thin film resistor, is applied. Line E shows the characteristic for the case when a silicon diffusion resistor is applied. Line F shows the characteristic for the case when a polycrystalline silicon is applied. As shown in FIG. 2, the protective resistors 11 shown by the characteristics of lines A and B can handle a current flow for twice to twenty times as long as other materials for the same current density. In the composition of Ni-Co alloy, although the inventors experimented with varying the ratio of weight of Ni from 10 to 90 wt %, and varying the ratio of weight of Co from 90 to 10 wt %, the characteristics thereof showed approximately the same characteristic as line A in FIG. 2. In the composition of Ni-Fe alloy, although the ratio of weight of Ni was varied from 60 to 90 wt %, and the ratio of weight of Fe was varied from 40 to 10 wt % in a similar way, the characteristics thereof showed approximately the same characteristic as line B in the FIG. 2. Ni-Co alloy can handle current for a slightly longer time than the Ni-Fe alloy for the same current density.

When a magnetic field of more than a predetermined value is applied to the ferromagnetic magnetoresistive material, the value of the resistance thereof saturates and becomes a constant value. Even in such a circumstance, since the variation of the resistance of usual ferromagnetic magnetoresistive material is less than 6% at most, there is no problem when such a ferromagnetic magnetoresistive material is used as the protective resistor 11.

Figure 3:
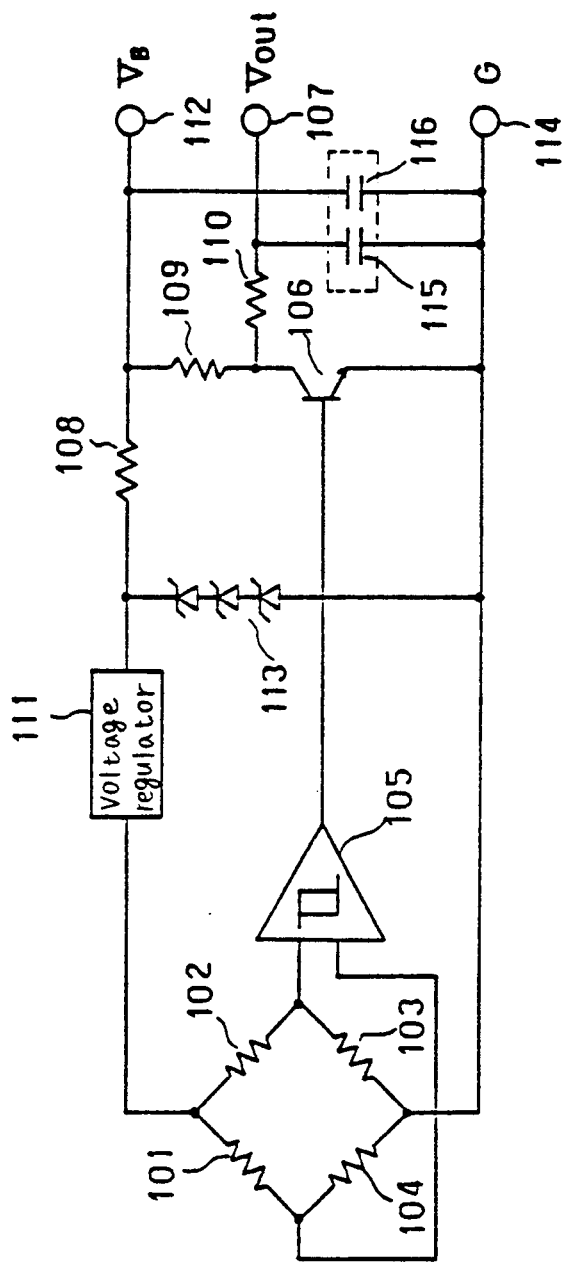
FIG. 3 is an electric circuit of the embodiment shown in FIG. 1.

FIG. 3 is an electric circuit of one embodiment of the device for detecting magnetism according to this invention. In FIG. 3, ferromagnetic magnetoresistive elements 101 to 104, each formed like element 10, form a full-bridge circuit. Ferromagnetic magnetoresistive elements 101 and 103 in opposite arms of the bridge are positioned in an in-phase relationship with each other and ferromagnetic magnetoresistive elements 102 and 104 in the other pair of opposite arms of the bridge are positioned in an opposite-phase relationship, when the magnetism to be measured is applied to elements 101 to 104. In that case, the variations of resistances of a pair of ferromagnetic magnetoresistive elements 101 and 103 and a pair of ferromagnetic magnetoresistive elements 102 and 104 are in an opposite relationship and are converted by the bridge circuit into voltage variations. The electric potential signal at the connecting point between ferromagnetic magnetoresistive elements 102 and 103 and the electric potential signal at the connecting point between ferromagnetic magnetoresistive elements 101 and 104, are both transferred to comparator 105. Comparator 105 comprises the bipolar transistor 20 of FIG. 1 and applies to the base of output transistor 106 an electric signal in accordance with the electric potential signal from the full-bridge circuit, which causes output transistor 106 to make a switching operation. The output electric potential level from output terminal (Vout) 107 varies in accordance with the switching operation of output transistor 106, which shows whether magnetism is being applied to ferromagnetic magnetoresistive elements 101 to 104.

Protective resistors 108 to 110 each like resistor 11, are made from the ferromagnetic magnetoresistive material mentioned above. Protective resistor 108 is electrically connected to the connecting point between power source terminal ($V_B$) 112 and voltage regulator 111. Protective resistor 109 is electrically connected to the connecting point between power source terminal($V_B$) 112 and the collector of output transistor 106. Protective resistor 110 is electrically connected to the connecting point between output terminal (Vout) 107 and the collector of transistor 106.

The function of each of the protective resistors 108 to 110 will now be described. The protective resistor 108 absorbs the high voltage (or a giant surge) inputted from an external device (not shown) through power source terminal ($V_B$) 112 to prevent the high voltage from being applied to and destroying voltage regulator 111, the full-bridge circuit or the comparator 105. Protective resistor 109 absorbs the high voltage inputted from the external device through power source terminal($V_B$) 112 to prevent the high voltage from being applied to and destroying output transistor 106. Protective resistor 110 absorbs high voltage inputted from an external device through output terminal (Vout) 107 to prevent the high voltage from being applied to and destroying output transistor 106.

Voltage regulator 111 regulates the voltage provided from power source terminal 112 to a predetermined voltage, for example, 5 V. Zener diodes 113 cause the electric current caused by the high voltage mentioned above to flow toward ground terminal (G) 114. Capacitors 115 and 116 absorb a high frequency noise. The constructional components mentioned above other than capacitors 115 and 116 are integrated into one chip.

Although this invention is described above by the embodiment thereof, it is not restricted thereto, since it is apparent that this invention can have many variables, including those enumerated below:

(1) In the above mentioned embodiment, the magnetoresistive elements and integrated circuit (IC) are integrated into one chip, but the magnetoresistive elements and IC also can be separated into two integrated chips.

(2) In the above embodiment, an electric circuit other than the comparator 105 comprising the bipolar transistor 20 as an amplifier circuit may be used as the signal processing circuit formed in the same substrate. For example, a hysteresis circuit comprising a Schmitt trigger circuit or the like may be formed as the signal processing circuit in case the device for detecting magnetism of this invention is used to control the rotation of a magnetic body, for example, in an encoder or the like.

Figure 4:
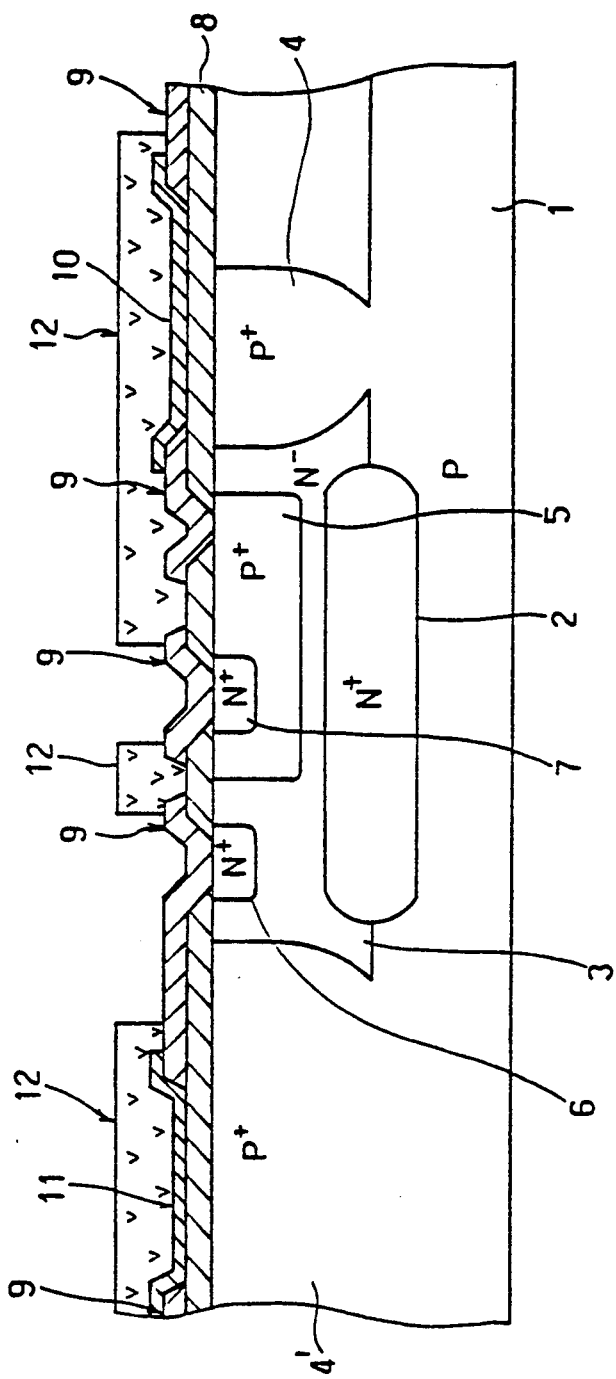
FIG. 4 is a cross sectional view of another embodiment of this invention.

(3) As shown in FIG. 4, protective resistor 11 may be formed apart from the region where the semiconductor element comprising the bipolar transistor 20 or the like is formed. In FIG. 4, resistor 11 is positioned over an added P+ isolating region 4' to the side of the transistor but on the same substrate. In this case, although protective resistor 11 generates heat while protective resistor 11 makes a noise-eliminating operation, it is possible to prevent such heat from adversely influencing the semiconductor element. Because protective resistor is formed apart from the bipolar transistor 20 the distance of transmission of heat from protective resistor 11 to the bipolar transistor 20 becomes longer. Therefore, heat reached at the bipolar transistor 20 is low temperature, and the heat does not give the bipolar transistor 20 adverse influence.

(4) The above mentioned embodiment is an example in which this invention is applied to a device for detecting magnetism. It should be noted that the merit of simplifying the process for producing the device is heightened because the magnetoresistive element and the protective resistor are formed simultaneously of the same material. However, this invention can also be effectively applied to another kind of semiconductor device that does not detect magnetism and is used, for example, in an automobile, with a motor or the like, which have the possibility that the noise of a high voltage is applied thereto but is absorbed by the protective resistor by a larger amount per its current density because of the material of which the protective resistor 11 is made.

This invention is not to be limited by the foregoing description or drawings but the scope of the invention is defined by the following claims.

What is claimed is:

1. A semiconductor device comprising:
   a substrate;
   a first semiconductor element provided on a first area of said substrate and including at least one part which operates using ferromagnetic magnetoresistive material;
   terminal means, provided on said substrate, for connection to an external device so as to pass an electrical signal through said terminal means;
   a second semiconductor element provided on a second area of said substrate physically separated from said first area, said second semiconductor element including protective resistor means including a ferromagnetic magnetoresistive material which is physically separated from said first semiconductor element and connected in a noise attenuation circuit for absorbing electric noise inputted from said terminal means; and
   conductive wiring means, provided between said first semiconductor element and said terminal means and between said second semiconductor element and said terminal means, for electrically connecting said first and second semiconductor elements with said terminal means.

2. A semiconductor device according to claim 1, wherein said protective resistor means is of a material selected from the group consisting of a Ni-Fe alloy and a Ni-Co alloy.

3. A semiconductor device according to claim 2, wherein said alloy of said protective resistor means has a weight ratio of Ni to its other component in a range of from 10 to 90 wt %.

4. A semiconductor device according to claim 1, wherein said first semiconductor element includes a bipolar transistor.

5. A semiconductor device according to claim 1, wherein said conductive wiring means is composed of aluminum.

6. A semiconductor device comprising:
   a substrate;
   a magnetism detecting means, including a magnetoresistive material, provided on a first area of said substrate, for generating an electric detecting signal in response to magnetism;
   a semiconductor element, provided on said substrate and electrically connected with said magnetism detecting means, for processing said detecting signal;
   terminal means, provided on said substrate, for connection to an external device so as to pass an electric signal through said terminal means;
   protective resistor means including a magnetoresistive material, provided on a second area of said substrate physically separated from said first area, said protective resistor means connected in a noise attenuation circuit for absorbing electric noise inputted from said terminal means; and
   conductive wiring means, provided between said semiconductor element and said terminal means and between said protective resistor means and said terminal means, for electrically connecting said semiconductor element with said terminal means at a first part of said wiring means, said first part being of a non-magnetoresistive material.

7. A semiconductor device according to claim 6, wherein both said magnetism detecting means and said protective resistor means are composed of at least one of a Ni-Fe alloy and a Ni-Co alloy.

8. A semiconductor device according to claim 7, wherein said protective resistor means has Ni in a weight ratio with respect to its other element in a range of from 10 to 90 wt %.

9. A semiconductor device according to claim 6, wherein said semiconductor element includes a bipolar transistor.

10. A semiconductor device according to claim 6, wherein said conductive wiring means is composed of aluminum.

* * * * *